(12) United States Patent
Hung et al.

(10) Patent No.: US 7,436,707 B2
(45) Date of Patent: Oct. 14, 2008

(54) FLASH MEMORY CELL STRUCTURE AND OPERATING METHOD THEREOF

(75) Inventors: Chih-Wei Hung, Hsin-Chu (TW); Da Sung, Hsin-Chu (TW); Cheng-Yuan Hsu, Hsin-Chu (TW)

(73) Assignee: Powership Semiconductor Corp., Hsin-Chu (TW)

( * ) Notice: Subject to any disclaimer, the term of this patent is extended or adjusted under 35 U.S.C. 154(b) by 680 days.

(21) Appl. No.: 11/160,693

(22) Filed: Jul. 6, 2005

(65) Prior Publication Data

US 2005/0232016 A1    Oct. 20, 2005

Related U.S. Application Data

(62) Division of application No. 10/605,419, filed on Sep. 30, 2003, now Pat. No. 6,963,105.

(51) Int. Cl.
*G11C 11/34* (2006.01)
*G11C 16/04* (2006.01)

(52) U.S. Cl. .................. 365/185.18; 365/185.26; 365/185.28; 365/185.29; 365/185.33; 257/314; 257/315; 257/316; 257/320; 257/321; 257/322; 257/326

(58) Field of Classification Search ............ 365/185.01, 365/185.18, 185.26, 185.28, 185.29, 185.33; 257/314, 315, 316, 320, 321, 322, 326
See application file for complete search history.

(56) References Cited

U.S. PATENT DOCUMENTS

| 4,698,787 | A | * | 10/1987 | Mukherjee et al. | 365/185.29 |
| 5,416,738 | A | * | 5/1995 | Shrivastava | 365/185.24 |
| 6,091,644 | A | | 7/2000 | Hsu et al. | |
| 2004/0065917 | A1 | * | 4/2004 | Fan et al. | 257/315 |

* cited by examiner

*Primary Examiner*—VanThu Nguyen
(74) *Attorney, Agent, or Firm*—Winston Hsu

(57) ABSTRACT

A flash memory cell structure has a substrate, a select gate, a first-type doped region, a shallow second-type doped region, a deep second-type doped region, and a doped source region. The substrate has a stacked gate. The select gate is formed on the substrate and adjacent to the stacked gate. The first-type ion formed region is doped in the substrate and adjacent to the select gate as a drain. The shallow second-type doped region is formed on one side of the first-type doped region below the stacked gate. The deep second-type doped region, which serves as a well, is formed underneath the first-type doped region with one side bordering on the shallow second-type doped region. The doped source region is formed on a side of the shallow second-type doped region as a source.

7 Claims, 10 Drawing Sheets

FLASH MEMORY CELL STRUCTURE AND OPERATING METHOD THEREOF

CROSS REFERENCE TO RELATED APPLICATIONS

This application is a divisional of application Ser. No. 10/605,419 filed Sep. 30, 2003.

BACKGROUND OF THE INVENTION

1. Field of the Invention

The present invention relates to a non-volatile memory cell structure, and more particularly, to a flash memory cell structure and an operating method thereof.

2. Description of the Prior Art

Refer to FIG. 1. A prior art flash memory cell structure 1 includes a substrate 10, a drain 11, a source 12, two field oxidation layers 13, a control gate 14, a floating gate 15, and a P well 16. The drain 11 and the source 12 are formed in the substrate 10 and between the field oxidation layers 13. A stacked gate, which includes the control gate 14 and the floating gate 15, is between the drain 11 and the source 12. Further, the P well 16 is implanted around the drain 11 and the source 12. As shown in FIG. 1, a gate voltage $V_G$ is applied to the control gate 14 for controlling the flash memory cell structure 1, and the floating gate 15 is floating. When the programming process is executed, the gate voltage $V_G$ is $-9V$, the drain voltage $V_D$ applied to the drain 11 is 6V, the source voltage $V_S$ is floating, and the base voltage $V_B$ applied to the substrate 10 is 0V. In this case, electrons ($e^-$) located in the floating gate 15 will be emitted to the drain 11 due to edge Fowler-Nordheim effect, such that the flash memory cell structure 1 is programmed. When the drain voltage $V_D$ is applied to the drain 11, however, a depletion region will be formed outside the drain 11 and therefore hot holes ($e^+$) will be generated. In that case, the lateral electric field will result in hot hole injection, and will seriously affect normal operation of the flash memory cell structure 1.

In view of the above-mentioned shortcomings, the prior art provides an improved flash memory cell structure and operating method thereof. Refer to FIG. 2, the drain 11 and the P well 16 are electrically short-circuited together and are applied with an identical voltage, such as 6V. In that case, the flash memory cell structure operates under the channel Fowler-Nordheim effect, and thus the depletion region will not be generated in the junction between the drain 11 and the P well 16, and neither will be the hot holes.

Although employing the channel Fowler-Nordheim effect in the foregoing flash memory cell structure can overcome drawbacks, this may result in other problems. Though the drain 11 and the P well 16 are electrically short-circuited together, the P well 16, however, extends into the substrate 10 Therefore the neighboring source 12 could be influenced, and further the operation of adjacent flash memory cell structures could be affected.

To avoid the adjacent source being affected because of the electrical connection of the drain 11 and the P well 16, another flash memory cell structure 2 is disclosed in U.S. Pat. No. 6,091,644. As shown in FIG. 3, the flash memory cell structure 2 includes a substrate 20, a first-type doped region 25, a shallow second-type doped region 26, a deep second-type doped region 27, and a doped source region 28. The substrate 25 includes a field oxidation layer 21 and a stacked gate. The field oxidation layer 21 has a channel stop 22 below. The stacked gate includes a control gate 23 and a floating gate 24. In the flash memory cell structure 2, the first-type doped region 25 is a drain, the deep second-type doped region 27 is a P well, and the doped source region 28 is a source. Each drain corresponds to a P well, and thus, operation of adjacent source and flash memory cell structure will not be influenced even if the drain and the P well are electrically short-circuited together.

Nevertheless, the drain and the P well are electrically short-circuited in the flash memory cell structure 2, thus the P well will have the same voltage potential as the drain when programming. Meanwhile, the adjacent flash memory cell structure to be programmed (not shown) is given the same gate voltage potential as the flash memory cell structure 2, so an edge program disturb issue will occur. For avoiding the edge program disturb issue, the prior art thickens the tunnel oxide layer on the edge of the floating gate. However, it is not easy to control the thickness in the manufacturing process, and the reliability will be further reduced. Furthermore, the flash memory cell structure adjacent to the flash memory cell structure 2 has leakage problems when the flash memory cell structure 2 is programmed. Generally speaking, those skilled in the art apply a specific voltage, such as $-2V$, to the control gate of the adjacent flash memory cell structure to overcome the leakage problem during programming. If a negative voltage is not applied, the charging pumping will increase, which could further cause a malfunction of the flash memory cell structure.

Therefore, a flash memory cell structure, which counters the edge program disturb issue, diminishes the over program problem, and reduces current leakage becomes desirable.

SUMMARY OF THE INVENTION

It is therefore a primary objective of the claimed invention to provide a flash memory cell structure, which solves the edge program disturb issue and the over program problem, and an operating method thereof.

According to the claimed invention, the flash memory cell structure includes a substrate, a select gate, a first-type doped region, a shallow second-type doped region, a deep second-type doped region, and a doped source region. The substrate has a stacked gate. The select gate is formed on the substrate and located on a side of the stacked gate. The first-type doped region, which serves as a drain, is formed in the substrate and adjacent to the select gate. The shallow second-type doped region is formed on a side of the first-type doped region below the stacked gate. The deep second-type doped region, which serves as a well, is formed underneath the first-type doped region with one side bordering on the shallow second-type doped region. The doped source region, which serves as a source, is formed on a side of the shallow second-type doped region.

Moreover, the claimed invention provides an operation method applied to the flash memory cell structure. In the claimed invention, when executing a programming process a high voltage is applied to the control gate, a voltage relatively lower than the control gate voltage is applied to the drain, the source is floating, and the select gate is grounded. When executing an erasing process, a low voltage is applied to the control gate, a voltage relatively higher than the control gate voltage is applied to the select gate, and the source and the drain are floating. When executing a reading process, a word line voltage is applied to the control gate, a voltage relatively lower than the word line voltage is applied to the source, the drain is grounded, and a power voltage is applied to the select gate.

The flash memory cell structure of the claimed invention has a select gate. Further, a high voltage is applied to the select gate, instead of being applied to the drain as in the prior art, such that electrons located in the floating gate will move to the select gate. Therefore, the edge program disturb issue and the over program problems are effectively avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
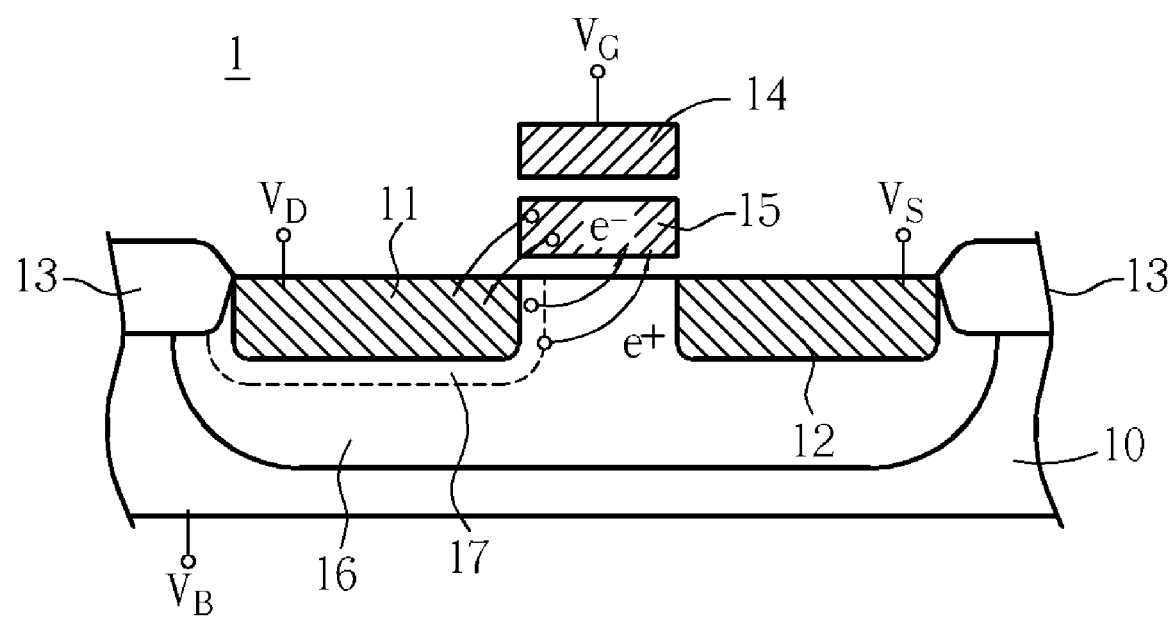
FIG. 1 is a schematic diagram illustrating a prior art flash memory cell structure.
Figure 2:
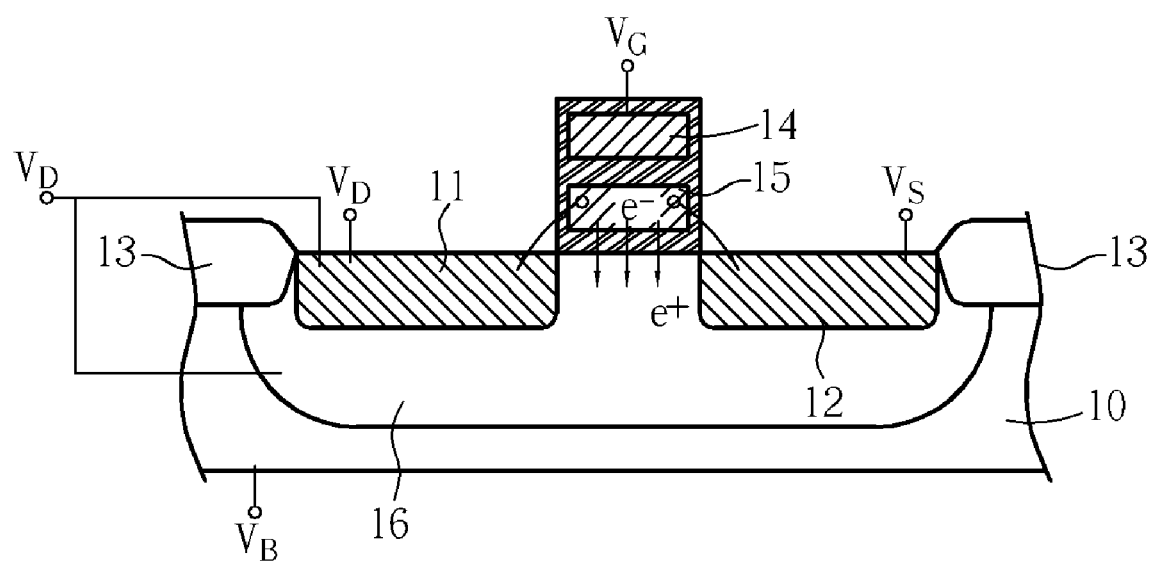
FIG. 2 is a schematic diagram illustrating another prior art flash memory cell structure.
Figure 3:
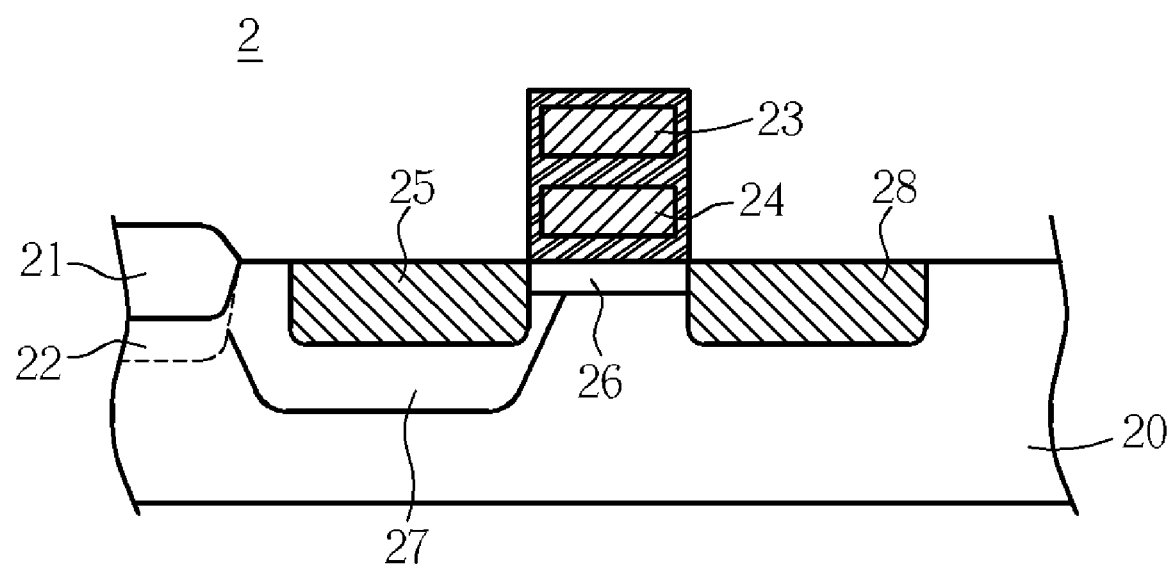
FIG. 3 is a schematic diagram illustrating a flash memory cell structure disclosed in U.S. Pat. No. 6,091,644.
Figure 4:
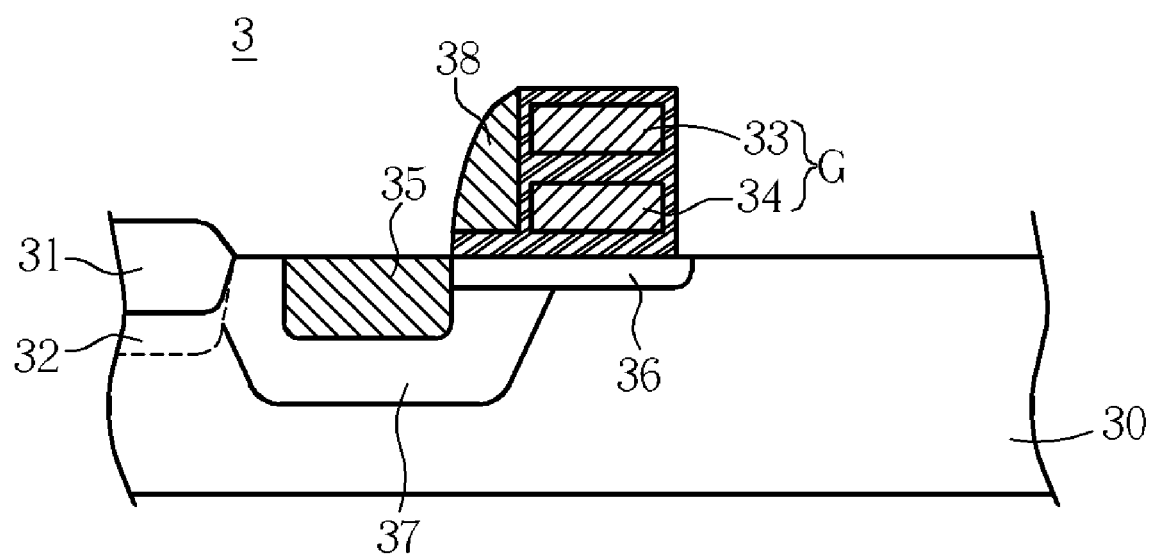
FIG. 4 is a schematic diagram illustrating a flash memory cell structure according to a preferred embodiment of the present invention wherein the doped source region is not shown.

Please refer to FIG. 4, which is a schematic diagram illustrating a flash memory cell structure 3 according to a preferred embodiment of the present invention. As shown in FIG. 4, the flash memory cell structure 3 includes a substrate 30, a first-type doped region 35, a shallow second-type doped region 36, a deep second-type doped region 37, and a select gate 38.

In this preferred embodiment, the substrate 30 includes a first field oxidation layer 31 and a stacked gate G. A channel stop 32 is formed underneath the first field oxidation layer 31, the stacked gate G further includes a control gate 33 and a floating gate 34, and the select gate 38 is formed on a side of the stacked gate G.

The first-type doped region 35 is formed in the substrate 30 and adjacent to the select gate 38 as a drain. The first-type doped region 35 can be an N type doped region in this embodiment.

The shallow second-type doped region 36 is located underneath the stacked gate G and adjacent to the first-type doped region 35, wherein the shallow second-type doped region 36 is a P type shallow-doped region.

The deep second-type doped region 37 is located around the first-type doped region 35 and adjacent to the shallow second-type doped region 36. The depth of the deep second-type doped region 37 is deeper than the depth of the shallow second-type doped region 36, and the deep second-type doped region 37 has the same doped ions as the shallow second-type doped region 36. The deep second-type doped region 37, which serves as a P well, is a P type deep-doped region. Generally speaking, the doped ions of the deep second-type doped region 37 and the shallow second-type doped region 36 are selected from the III A group, including elements such as boron.

Figure 5:
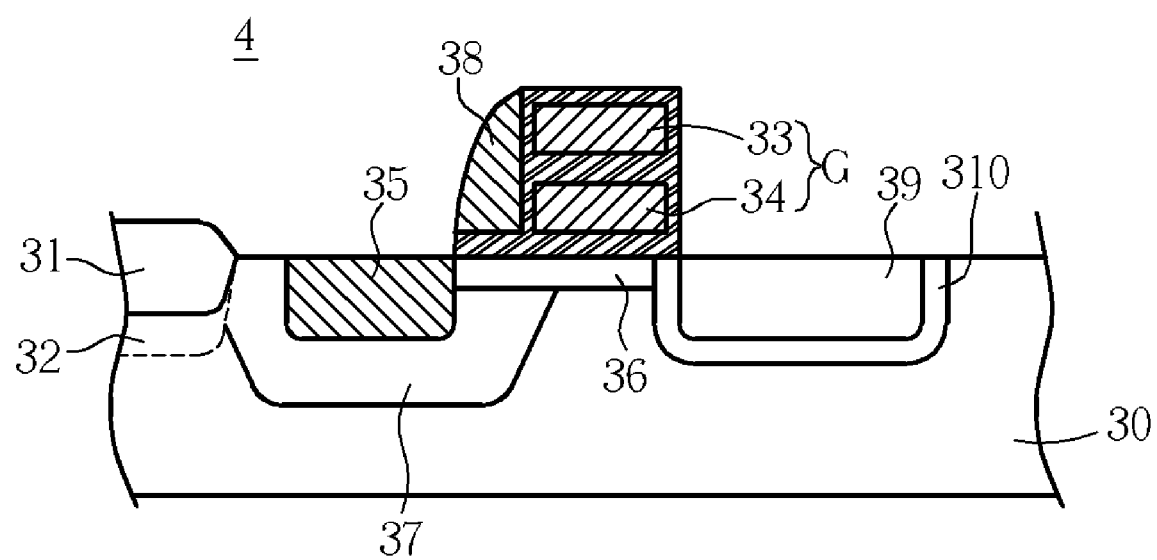
FIG. 5 to FIG. 6 are schematic diagrams illustrating a flash memory cell structure according to another embodiment of the present invention wherein the doped source region is shown.
Figure 6:
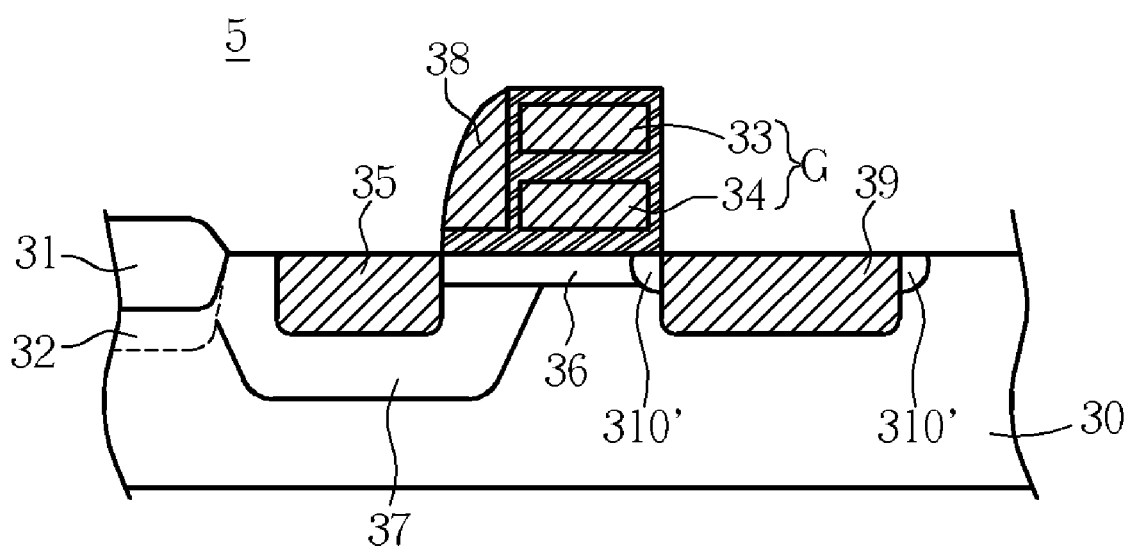

Additionally, the flash memory cell structure 3 further includes a doped source region located on a side of the shallow second-type doped region 36 as a source. The doped source region is not limited to be located on the opposite side of the drain. Theoretically, the source of the flash memory cell structure can be at any proper location in the substrate 30. Refer to FIG. 5 and FIG. 6, which are used to illustrate the source structure but not to limit the present invention.

As shown in FIG. 5, a flash memory cell structure 4 of another preferred embodiment further includes a doped source region 39, which serves as a source, located adjacent to the shallow second-type doped region 36 and on the opposite side of the first-type doped region 35. In addition, a shallow doped region 310 having the same doped ions as the doped source region 39 is formed underneath the doped source region 39, nevertheless the doped concentration of the shallow doped region 310 is lower. In this embodiment, the doped source region 39 and the shallow doped region 310 are N type doped regions.

As shown in FIG. 6, a flash memory cell structure 5 of another embodiment is similar to the flash memory cell structure 4. What is different is an LDD region 310' replaces the shallow doped region 310. Generally speaking, the doped ions of the first-type doped region 35, the doped source region 39, and the shallow doped region 310 or the LDD region 310' are selected from the V A group, which includes elements such as phosphorous.

As U.S. Pat. No. 6,091,644 discloses, the deep second-type doped region 37, serving as the P well, and the first-type doped region 35, serving as the drain, are electrically short-circuited together by metal (not shown). In this embodiment, the metal makes the deep second-type doped region 37 and the first-type doped region 35 short-circuit together by penetrating the junction between the first-type doped region 35 and the deep second-type doped region 37, or by linking the exposed surface of the first-type doped region 35 and the deep second-type doped region 37 together.

Figure 7:
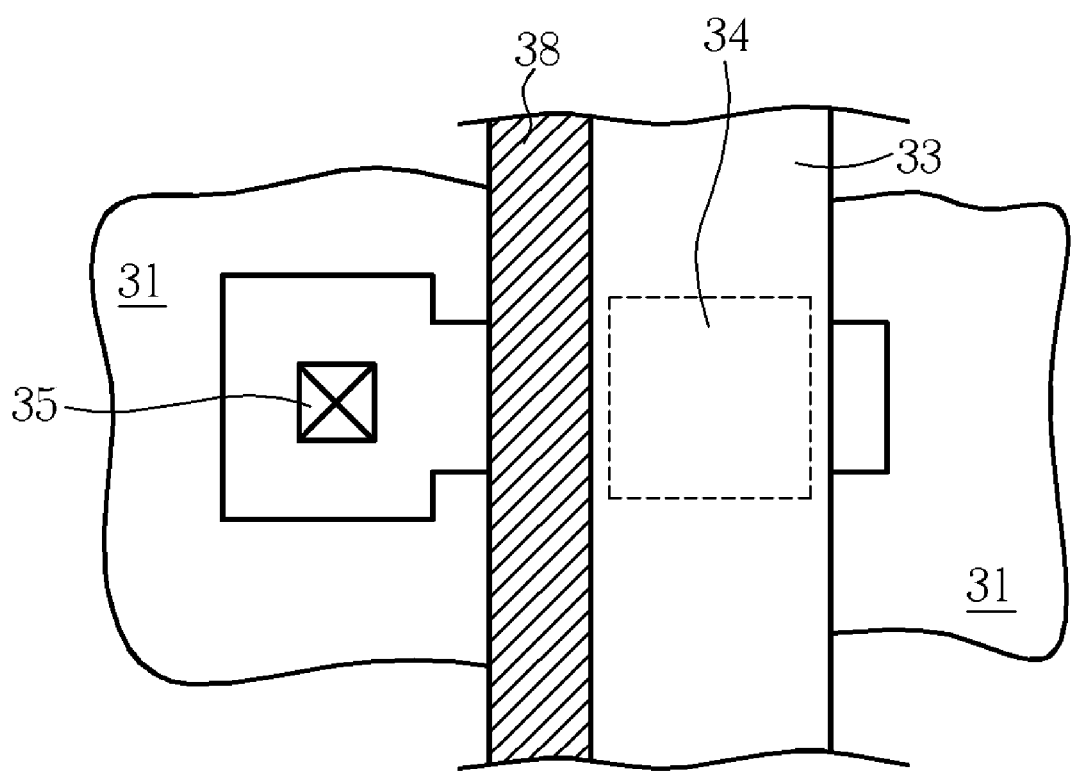
FIG. 7 is a schematic diagram illustrating a top view of a flash memory cell structure according to a preferred embodiment of the present invention.

Refer to FIG. 7, which is a top view of the flash memory cell structure according to the preferred embodiment of the present invention. Since the source can be at any location in the substrate 30, the source is not shown in FIG. 7. As shown in FIG. 7, the flash memory cell structure includes a control gate 33 serving as a word line, a floating gate 34, a select gate 38 adjacent to the floating gate 34 and the control gate 33, and a first-type doped region 35 serving as a drain. A field oxidation layer 31 surrounds the active area of the flash memory cell structure. The first-type doped region 35 and the floating gate 34 are separated by the select gate 38.

Figure 8A:
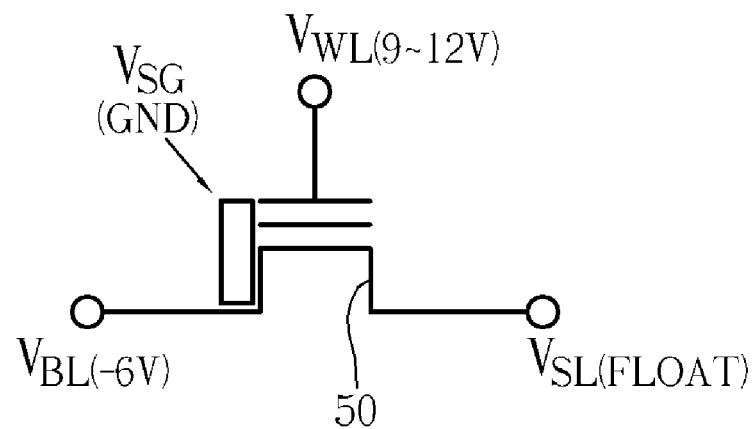
FIG. 8A to FIG. 8C are circuit diagrams of a flash memory cell structure according to the preferred embodiment of the present invention.
Figure 8B:
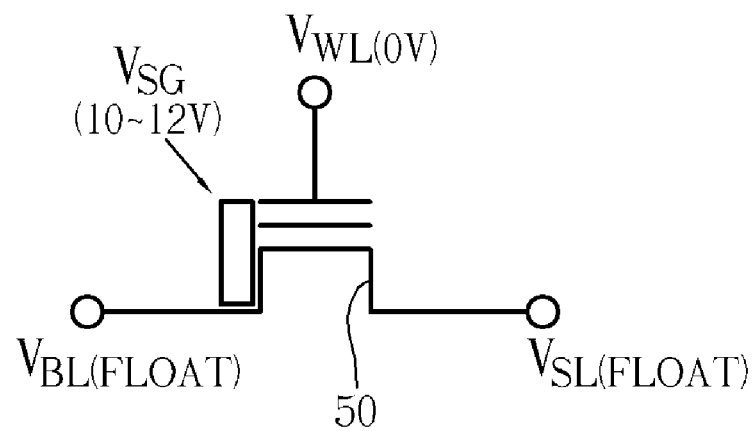
Figure 8C:
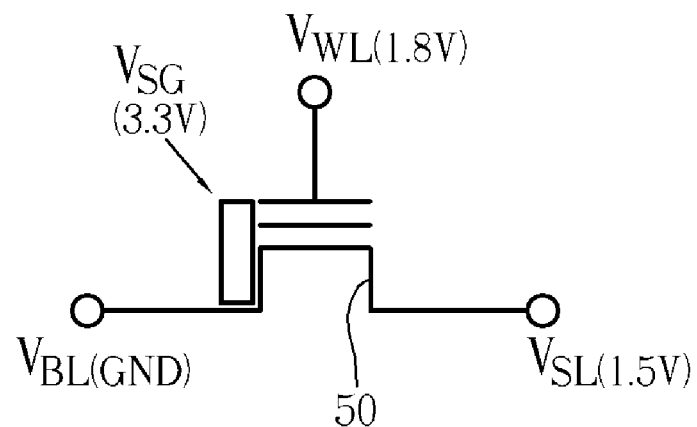

Since the select gate 38 is formed between the floating gate 34 and the first-type doped region 35, the select gate 38 is used to shut off the channel for preventing current leakage, which results from over programming. Therefore, circuits for preventing the over program problem are not necessary in the flash memory cell structure. Furthermore, the select gate 38 of the present invention can also prevent the edge program disturb issue. Refer to FIG. 8A to FIG. 8C, which are circuit diagrams illustrating an operating method of the flash memory cell structure in the preferred embodiment of the present invention.

FIG. 8A, FIG. 8B, and FIG. 8C respectively illustrate the programming, erasing, and reading process of a flash memory cell structure 50. The flash memory cell structure 50 is a NOR type flash memory cell structure, such as the previously described flash memory cell structure 3, 4, or 5. A word line voltage $V_{WL}$ is applied to the control gate, a select gate voltage $V_{SG}$ is applied to the select gate, a source line voltage $V_{SL}$ is applied to the source, and a bit line voltage $V_{BL}$ is applied to the drain. In addition, the bit line voltage $V_{BL}$ and the P well of the flash memory cell structure 50 are electrically short-circuited.

As shown in FIG. 8A, when executing a programming process, a high word line voltage $V_{WL}$ (such as 9 to 12V) is applied to the control gate, a bit line voltage $V_{BL}$ (such as −9V) that is lower than the word line voltage $V_{WL}$ is applied to the drain, the source is floating, and the select gate is grounded. Meanwhile, electrons located in the drain move to the floating gate by the Fowler-Nordheim effect.

As shown in FIG. 8B, when executing an erasing process a low word line voltage $V_{WL}$ (such as 0V) is applied to the control gate, a select gate voltage $V_{SG}$ (such as 10 to 12V) that is higher than the word line voltage $V_{WL}$ is applied to the select gate, and the source and the drain are floating. The erasing process is performed by the floating gate and the select gate, which means the erasing action is performed in a poly-to-poly way. Moreover, the critical voltage is negative in the erasing process since the flash memory cell structure 50 includes the select gate, and thus, current leakage resulting from over programming will not occur as in other flash memory cells.

As shown in FIG. 8C, when executing a reading process, a high word line voltage $V_{WL}$ (such as 1.8V) is applied to the control gate, a source line voltage $V_{SL}$ (such as 1.5V) that is lower than the word line voltage $V_{WL}$ is applied to the source, the drain is grounded, and a power voltage $V_{CC}$ (such as 3.3V) is applied to the select gate. During the reading process the sources of other flash memory cell structures are floating, which means other bit lines are floating.

Those skilled in the art know that an EEPROM cell needs a select transistor, which enlarges the size of the memory cell. The select gate of the present invention plays the role of a select transistor, and thus the flash memory cell can be regarded as a micro EEPROM cell without a select transistor. Please refer to FIG. 9A to FIG. 9C, which illustrate a byte programming and a byte erasing process according to another embodiment of the present invention. This embodiment differs from the preceding embodiment in that it operates in a byte-erasing way, rather than in a page-erasing way.

Figure 9A:
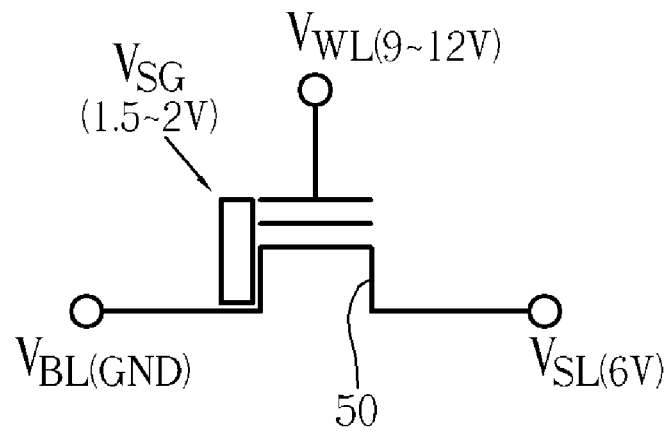
FIG. 9A to FIG. 9C are circuit diagrams of a flash memory cell structure according to another preferred embodiment of the present invention.

As shown in FIG. 9A, when executing a programming process, a high word line voltage $V_{WL}$ (such as 9 to 12V) is applied to the control gate, a source line voltage $V_{SL}$ (such as 6V) that is lower than the word line voltage $V_{WL}$ is applied to the source, the drain is grounded, and a select gate voltage $V_{SG}$ (such as 1.5 to 2V) is applied to the select gate.

Figure 9B:
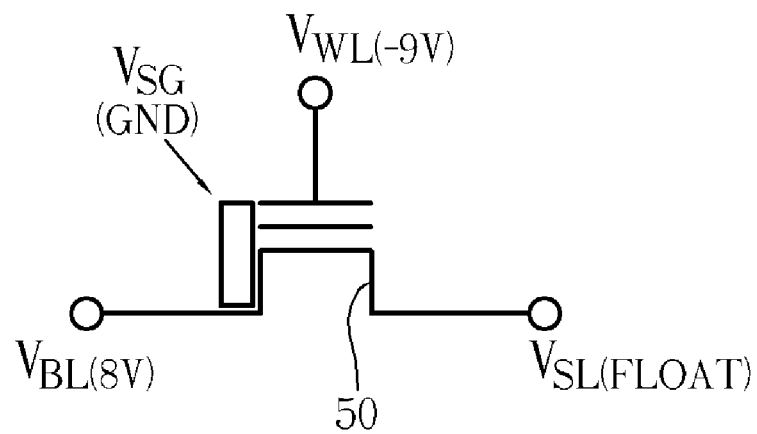

As shown in FIG. 9B, when executing an erasing process, a low word line voltage $V_{WL}$ (such as −9V) is applied to the control gate, a high voltage (such as 8V) is applied to the drain, the source is floating, and the select gate is grounded.

Figure 9C:
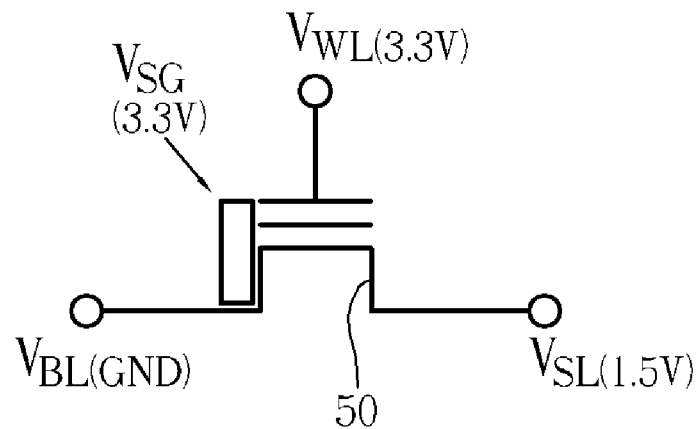

As shown in FIG. 9C, when executing a reading process, a word line voltage $V_{WL}$ (such as 3.3V) is applied to the control gate, a source line voltage $V_{SL}$ (such as 1.5V) that is lower than the word line voltage $V_{WL}$ is applied to the source, the drain is grounded, and a power voltage $V_{CC}$ (such as 3.3V) is applied to the select gate.

Figure 10A:
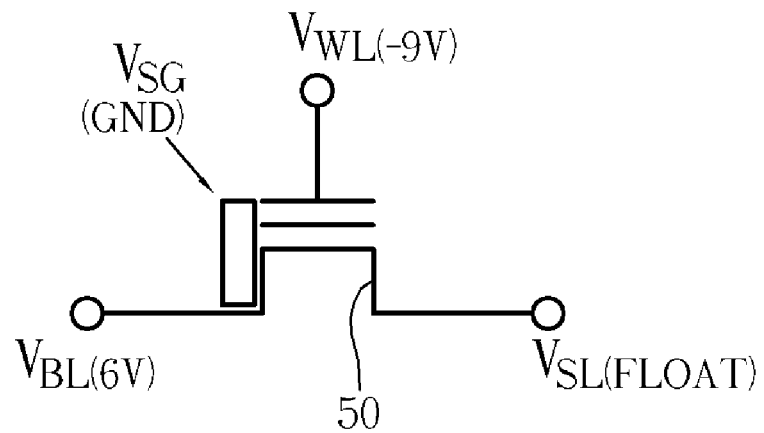
FIG. 10A to FIG. 10C are circuit diagrams of a flash memory cell structure according to another preferred embodiment of the present invention.
Figure 10B:
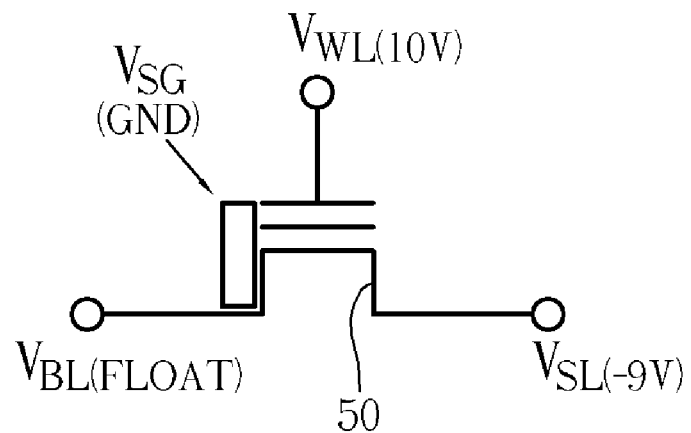
Figure 10C:
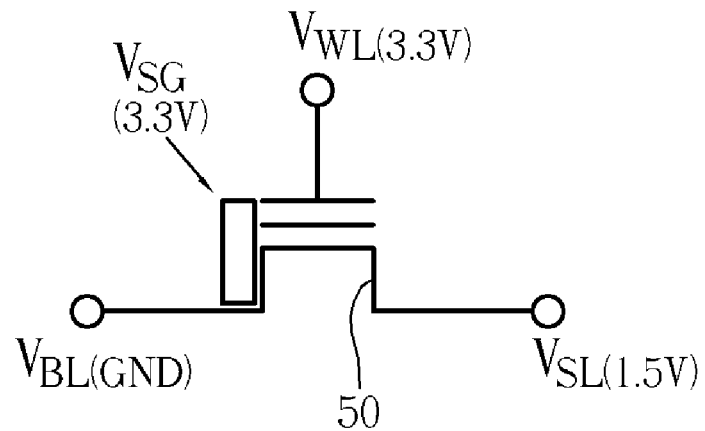

Moreover, the flash memory cell structure of the present invention can be regarded as a BiNOR type memory cell, and an operating method thereof is shown in FIG. 10A to FIG. 10C.

As shown in FIG. 10A, when executing a programming process, a low word line voltage $V_{WL}$ (such as −9V) is applied to the control gate, a bit line voltage $V_{BL}$ (such as 6V) that is higher than the word line voltage $V_{WL}$ is applied to the drain, the source is floating, and the select gate is grounded.

As shown in FIG. 10B, when executing an erasing process, a word line voltage $V_{WL}$ (such as 10V) is applied to the control gate, a source line voltage $V_{SL}$ (such as −9V) that is lower than the word line voltage $V_{WL}$ is applied to the source, the drain is floating, and the select gate is grounded.

As shown in FIG. 10C, when executing a reading process, a word line voltage $V_{WL}$, such as a power voltage $V_{CC}$ (3.3V) is applied to the control gate, a source line voltage $V_{SL}$ (such as 1.5V) that is lower than the word line voltage $V_{WL}$ is applied to the source, the drain is grounded, and a power voltage $V_{CC}$ (such as 3.3V) is applied to the select gate.

In summary, the flash memory cell structure includes a select gate installed between a floating gate and a first-type doped region, such that the over program state is allowed and the current leakage can be effectively avoided. Furthermore, in the operating method of the flash memory cell structure of the present invention, a high voltage is applied to the select gate, such that electrons located in the floating gate will move to the select gate. That is to say, the flash memory cell structure is operated in a poly-to-poly way, and thus, the edge program disturb issue and the over program problem are effectively avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating a flash memory cell structure, the flash memory cell structure comprising a substrate, a select gate, a first-type doped region, a shallow second-type doped region, a deep second-type doped region, and a doped source region, the substrate having a stacked gate including a control gate, the select gate being formed on the substrate and adjacent to a side of the stacked gate, the first-type doped region being located in the substrate and adjacent to the select gate as a drain, the shallow second-type doped region surrounding the first-type doped region and being short-circuited to the shallow second-type doped region, the doped source being located on a side of the shallow second-type doped region as a source, the method comprising:
    applying a high voltage to the control gate, applying a voltage relatively lower than the voltage applied to the control gate to the drain, floating the source, and grounding the select gate in a programming process;
    applying a low voltage to the control gate, applying a voltage relatively higher than the voltage applied to the control gate to the select gate, and floating the source and the drain in an erasing process; and
    applying a word line voltage to the control gate, applying a voltage relatively lower than the word line voltage to the source, grounding the drain, and applying a power voltage to the select gate in a reading process.

2. The method of claim 1 wherein the flash memory cell structure is a NOR type flash memory cell structure.

3. A method of operating a flash memory cell structure, the flash memory cell structure comprising a substrate, a select gate, a first-type doped region, a shallow second-type doped region, a deep second-type doped region, and a doped source region, the substrate having a stacked gate including a control gate, the select gate being formed on the substrate and adjacent to a side of the stacked gate, the first-type doped region being located in the substrate and adjacent to the select gate as a drain, the shallow second-type doped region surrounding the first-type doped region and being short-circuited to the shallow second-type doped region, the doped source being located on a side of the shallow second-type doped region as a source, the method comprising:

applying a high voltage to the control gate, applying a voltage relatively lower than the voltage applied to the control gate to the source, applying a voltage relatively lower than the voltage applied to the source to the select gate, and grounding the drain in a programming process;

applying a low voltage to the control gate, applying a voltage relatively higher than the voltage applied to the control gate to the drain, floating the source, and grounding the select gate in an erasing process; and applying a word line voltage to the control gate, applying a voltage relatively lower than the word line voltage to the source, applying a power voltage to the select gate, and grounding the drain in a reading process.

4. The method of claim 3 wherein the operations of the flash memory cell structure are performed in a manner of byte program and byte erase.

5. A method of operating a flash memory cell structure, the flash memory cell structure comprising a substrate, a select gate, a first-type doped region, a shallow second-type doped region, a deep second-type doped region, and a doped source region, the substrate having a stacked gate including a control gate, the select gate being formed on the substrate and adjacent to a side of the stacked gate, the first-type doped region being located in the substrate and adjacent to the select gate as a drain, the shallow second-type doped region surrounding the first-type doped region and being short-circuited to the shallow second-type doped region, the doped source being located on a side of the shallow second-type doped region as a source, the method comprising:

applying a low voltage to the control gate, applying a voltage relatively higher than the voltage applied to the control gate to the drain, floating the source, and grounding the select gate in a programming process;

applying a high voltage to the control gate, applying a voltage relatively lower than the voltage applied to the control gate to the source, floating the drain, and grounding the select gate in an erasing process; and applying a word line voltage to the control gate, applying a voltage relatively lower than the word line voltage to the source, applying a power voltage to the select gate, and grounding the drain in a reading process.

6. The method of claim 5 wherein the flash memory cell structure is a BiNOR type flash memory cell structure.

7. The method of claim 5 wherein the word line voltage is identical to the power voltage in the reading process.

* * * * *

UNITED STATES PATENT AND TRADEMARK OFFICE
CERTIFICATE OF CORRECTION

PATENT NO. : 7,436,707 B2 Page 1 of 1
APPLICATION NO. : 11/160693
DATED : October 14, 2008
INVENTOR(S) : Chih-Wei Hung, Da Sung and Cheng-Yuan Hsu It is certified that error appears in the above-identified patent and that said Letters Patent is hereby corrected as shown below:

On the title page item (73), correct the name of the assignee from "Powership Semiconductor Corp." to "Powerchip Semiconductor Corp."

Signed and Sealed this

Twenty-third Day of December, 2008

JON W. DUDAS
*Director of the United States Patent and Trademark Office*

UNITED STATES PATENT AND TRADEMARK OFFICE
CERTIFICATE OF CORRECTION

PATENT NO.         : 7,436,707 B2                                    Page 1 of 1
APPLICATION NO. : 11/160693
DATED              : October 14, 2008
INVENTOR(S)        : Chih-Wei Hung, Da Sung and Cheng-Yuan Hsu It is certified that error appears in the above-identified patent and that said Letters Patent is hereby corrected as shown below:

On the title page, item (73), correct the name of the assignee from "Powership Semiconductor Corp." to "Powerchip Semiconductor Corp."
Title Page item (30), Foreign Application Priority Data, it should be supplemented with:
--Jan. 28, 2003 (TW)....................092101900--

Signed and Sealed this

Seventeenth Day of February, 2009

JOHN DOLL
*Acting Director of the United States Patent and Trademark Office*